(12) United States Patent
Tatsuno et al.

(10) Patent No.: US 7,292,519 B2
(45) Date of Patent: Nov. 6, 2007

(54) OPTICAL HEAD WITH LASERS AND MIRRORS IN A RECESS FORMED IN A SUBSTRATE

(75) Inventors: Kimio Tatsuno, Tokyo (JP); Masahide Tokuda, Ome (JP); Hirohisa Sano, Niiza (JP); Toshiaki Tanaka, Kodaira (JP); Takeshi Shimano, Tokorozawa (JP); Shigeru Nakamura, Tachikawa (JP); Takeshi Maeda, Kokubunji (JP); Akira Arimoto, Huchu (JP)

(73) Assignee: Hitachi, Ltd., Tokyo (JP)

( * ) Notice: Subject to any disclaimer, the term of this patent is extended or adjusted under 35 U.S.C. 154(b) by 488 days.

(21) Appl. No.: 11/028,325

(22) Filed: Jan. 4, 2005

(65) Prior Publication Data

US 2005/0122880 A1 Jun. 9, 2005

Related U.S. Application Data

(63) Continuation of application No. 09/512,822, filed on Feb. 25, 2000, now abandoned.

(30) Foreign Application Priority Data

Aug. 19, 1999 (JP) ................... 11-232136

(51) Int. Cl.
*G11B 7/00* (2006.01)
(52) U.S. Cl. .................................... 369/120
(58) Field of Classification Search ............... 369/120, 369/121, 122, 44.12
See application file for complete search history.

(56) References Cited

U.S. PATENT DOCUMENTS

| | | | |
|---|---|---|---|
| 3,668,404 A | 6/1972 | Lehovec | 250/552 |
| 4,750,799 A | 6/1988 | Kawachi et al. | 350/96.11 |
| 5,446,719 A | 8/1995 | Yoshida et al. | 369/116 |
| 5,621,714 A | 4/1997 | Kobayashi et al. | 369/110.03 |
| 5,629,916 A | 5/1997 | Komiya | 369/110 |
| 5,727,111 A | 3/1998 | Kume et al. | 385/147 |
| 5,790,502 A | 8/1998 | Horinouchi et al. | 369/112 |
| 5,978,404 A | 11/1999 | Ishihara | 372/50 |
| 6,016,186 A | 1/2000 | Mizutani | 355/53 |
| 6,100,944 A * | 8/2000 | Sharp et al. | 349/19 |
| 6,108,283 A | 8/2000 | Fujita et al. | 369/44.23 |
| 6,111,827 A | 8/2000 | Miike | 369/44.14 |
| 6,125,087 A | 9/2000 | Ohnishi et al. | 369/44.23 |
| 6,154,434 A | 11/2000 | Shibano et al. | 369/112 |
| 6,160,774 A | 12/2000 | Gage et al. | 369/44.42 |
| 6,195,485 B1 | 2/2001 | Coldren et al. | 385/49 |
| 6,211,511 B1 | 4/2001 | Shih et al. | 250/214 R |
| 6,314,063 B1 | 11/2001 | Nemoto | 369/44.12 |

(Continued)

FOREIGN PATENT DOCUMENTS

EP 0860819 8/1998

(Continued)

*Primary Examiner*—Nabil Hindi
(74) *Attorney, Agent, or Firm*—Mattingly, Stanger, Malur & Brundidge, P.C.

(57) ABSTRACT

An integrated optical head records and reproduces information to and from optical discs of different types, including CD and DVD, with use of a single information recording/reproducing apparatus. The optical head has a plurality of semiconductor lasers of different wavelengths integrated by index alignment onto a substrate formed with an optoelectric integrated circuit, photodetection patterns, and a reflecting mirror.

2 Claims, 8 Drawing Sheets

U.S. PATENT DOCUMENTS

| | | | |
|---|---|---|---|
| 6,366,548 B1 | 4/2002 | Ohyama | 369/112.04 |
| 6,487,015 B2 | 11/2002 | Kitamura et al. | 359/558 |
| 6,549,493 B1 | 4/2003 | Nakamura et al. | 369/44.32 |
| 6,646,975 B1 | 11/2003 | Uchizaki et al. | 369/121 |

FOREIGN PATENT DOCUMENTS

| | | |
|---|---|---|
| JP | 1-150244 | 6/1989 |
| JP | 1-162345 | 6/1989 |
| JP | 04349687 | 12/1992 |
| JP | 6-232226 | 8/1994 |
| JP | 07-134829 | 5/1995 |
| JP | 10-021577 | 1/1998 |
| JP | 10-283652 | 10/1998 |
| JP | 11-053759 | 2/1999 |
| JP | 11-126869 | 5/1999 |

* cited by examiner

FIG. 3B

A A' CROSS SECTION

FIG. 3A

A A' CROSS SECTION

B B' CROSS SECTION

OPTICAL HEAD WITH LASERS AND MIRRORS IN A RECESS FORMED IN A SUBSTRATE

This is a continuation application of U.S. Ser. No. 09/512,822, filed Feb. 25, 2000, now abandoned.

BACKGROUND OF THE INVENTION

The present invention relates to a laser module or an optical head. For example, the invention relates to a laser module or an optical head in which a semiconductor laser beam modulated by an electric signal is applied to an optical information recording medium such as an optical disc to record information on the medium or reproduce a recorded information from the medium. In particular, the invention is concerned with a laser module or an optical head each using a plurality of light sources.

In an optical head mounted on an optical disc recording and read-out apparatus, light sources and photodetectors are separated from each other. Consequently, it is impossible to attain a high fabrication integration density of light sources and photodetectors and hence it has so far impossible to attain the reduction in size and thickness of the entire optical disc apparatus. In an effort to solve this problem, a hybrid integration of photodetectors and semiconductor lasers in a reproducing head of an optical disc has been tried heretofore as is disclosed in Japanese Patent Laid-open No. Hei 1-150244.

SUMMARY OF THE INVENTION

Recently there has been developed an optical disc apparatus capable of playing various optical discs of CD, CD-ROM, CD-R, and CD-Rewritable specifications having a wavelength of 780 nm and DVD, DVD-ROM, and DVD-RAM specifications having a wavelength of 65.0 nm, in which, however, light sources and photodetectors are separated for semiconductor lasers of different wavelengths. Further, lasers of blue or purple color or even shorter wavelengths, which are more improved in recording density, are going to be used in future. Thus, an increase in the number of components in the optical head will be unavoidable. Under the circumstances, a further reduction in size and thickness of the entire apparatus such as an optical disc recording and read-out apparatus is desired.

It is an object of the present invention to improve the above-mentioned problems. More particularly, it is an object of the invention to provide a breakthrough for reducing the size and thickness of the whole of a driver capable of recording and reproducing information for various optical discs.

According to the first means adopted in the present invention, various semiconductor lasers of different wavelengths generated and photodetectors corresponding to those different wavelengths are subjected to alignment with a masking accuracy and then the plural semiconductor lasers are integrated as hybrid integration to reduce the number of components to a level equal to that of a monolithic configuration. According to the first means, moreover, although a plurality of optical paths have been used in the conventional optical head, a single optical path corresponds thereto.

According to the second means adopted in the present invention, index marks for alignment are affixed onto both a silicon substrate with photodetectors formed thereon and semiconductor lasers, their images are formed on a photo-electric conversion surface such as CCD and are inputted into a computer, followed by calculation of centroids of the marks and alignment. The centroid calculation permits ensuring a submicron order of alignment accuracy.

According to the third means adopted in the present invention, a reflecting mirror is formed on a silicon substrate with photodetectors formed thereon. More specifically, an off-axis substrate of 9.7 degrees or so is provided, then a reflecting mirror of 45 degrees or so is formed thereon by an anisotropic etching of silicon, and a beam emitted from a semiconductor laser is reflected by the mirror and is bent in a direction nearly perpendicular to the silicon substrate surface.

According to the fourth means adopted in the present invention, the width of the reflecting mirror is defined relative to a beam spread angle of a semiconductor laser. More particularly, the beam emitted from a semiconductor laser has a spread width approximated by Gaussian distribution. If this spread is intercepted near a light spot of the semiconductor laser, there occurs a Fresnel diffraction phenomenon, which changes into aberration when a spot is formed by an objective lens located just before an optical disc, with consequent decrease in central intensity of the spot. As a result, the power for resolving pits on the optical disc decreases and there occurs an error in a reproduced signal. To avoid this inconvenience, the width of a reflecting mirror is set so as to become wider than the full width at half maximum of the spread of the semiconductor laser beam at the position of the reflecting mirror.

According to the fifth means adopted in the present invention, an amplifier for electrically amplifying light currents generated by photodetectors is formed monolithically on a silicon substrate with the photodetectors formed thereon, and a tilted mirror alignment index mark is affixed onto the silicon substrate.

According to the six means adopted in the present invention, the above second and fifth means are combined together and a plurality of semiconductor lasers and a monolithically integrated silicon are integrated as hybrid integration with a higher alignment accuracy than that of the index mark.

According to the seventh means adopted in the present invention, an amplifier for electrically amplifying light currents generated by photodetectors is formed monolithically on a silicon substrate with the photodetectors formed thereon, and when semiconductor lasers are soldered onto the silicon substrate with a tilted mirror formed thereon and with an alignment index mark affixed thereto, a material having a high thermal conductivity is interposed between the semiconductor lasers and the silicon substrate for the purpose of widely diffusing the heat generated from the semiconductor lasers.

According to the eighth means adopted in the present invention, an amplifier for electrically amplifying light currents generated by photodetectors is formed monolithically on a silicon substrate with photodetectors formed thereon, and when semiconductor lasers are soldered onto the silicon substrate with a tilted mirror formed thereon and an alignment index mark affixed thereto, a material having a stress relaxation effect is interposed between the semiconductor lasers and the silicon substrate for the purpose of relaxing a stress induced by a difference in thermal expansion coefficient between the two.

BRIEF DESCRIPTION OF THE DRAWINGS

FIGS. 3A and 3B are structural diagrams of an integrated light source used in the embodiment;

DESCRIPTION OF THE PREFERRED EMBODIMENTS

Figure 1:
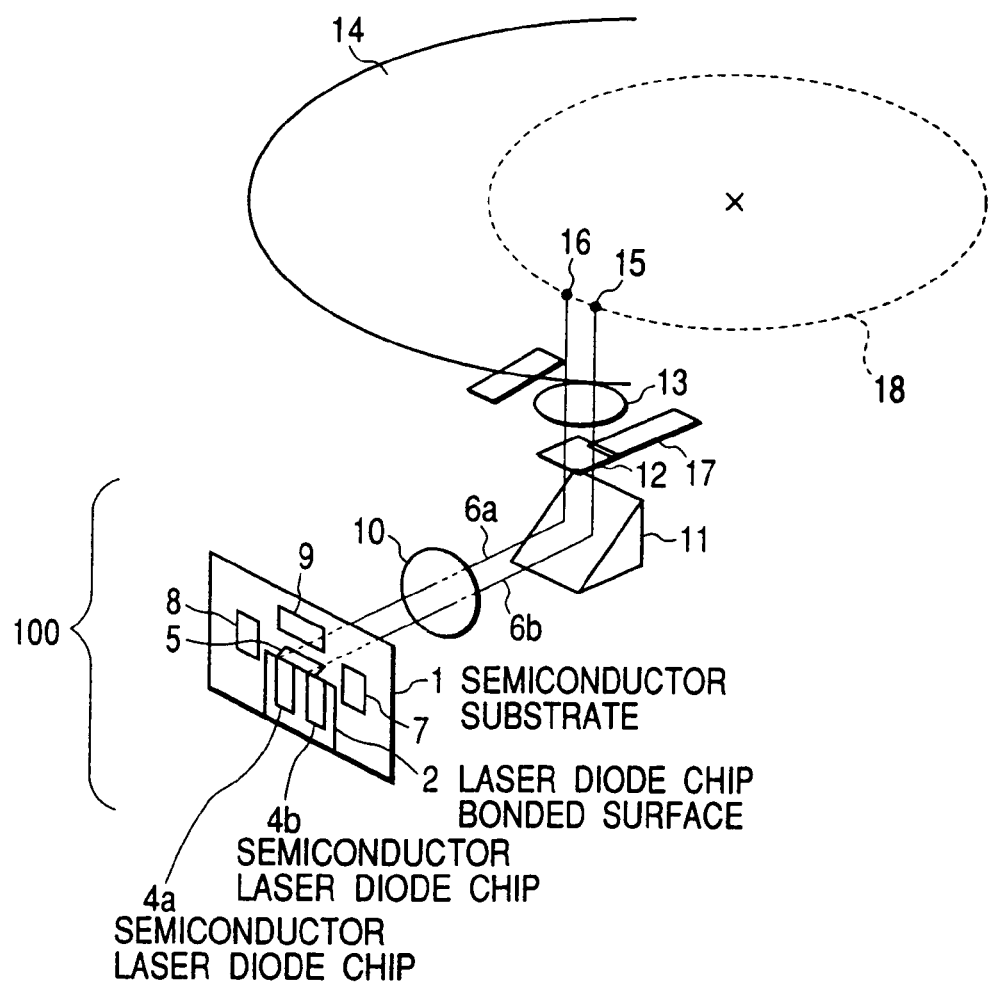
FIG. 1 is a diagram showing an optical head of a single optical path carrying an integrated light source module according to an embodiment of the present invention.

FIG. 1 illustrates the configuration of an optical head according to the present invention. An integration module 100 comprises a semiconductor substrate 1, semiconductor laser chips 4a and 4b, a reflecting mirror 5, and photodetectors 7, 8 and 9. Laser beams, indicated at 6a and 6b, from the integration module 100 are collimated by a collimator lens 10, then pass through a mirror 11 and a grating plate 12, and reach an objective lens 13, whereby the beams are formed as spots 15 and 16 on a surface of an optical disc 14. The objective lens 13 comprises plural such lenses according to wavelengths of the semiconductor lasers or a single lens capable of focusing beams of different wavelengths. The objective lens is focused onto a recording surface of the optical disc in accordance with a rotational movement of the same disc by means of an actuator 17 and performs tracking, that is, follows a recording track 18 formed on the disk surface. Thus, in accordance with ON or OFF of the semiconductor lasers, signals are recorded as a train of pits on the optical disc or already recorded pits are read out to reproduce signals. By thus integrating a plurality of semiconductor lasers in the integration module 100, the number of collimator lens 10, that of objective lens 13 and that of mirror 11 each become one and it is possible to singularize the optical path in the optical head. Using this optical head, for example CD, CD-R having a thickness of 1.2 mm can be subjected to recording and reproduction using the semiconductor laser 4a of 780 nm in wavelength, while DVD, DVD-RAM having a thickness of 0.6 mm can be subjected to recording and reproduction using the semiconductor laser 4b of 650 nm in wavelength.

Figure 2:
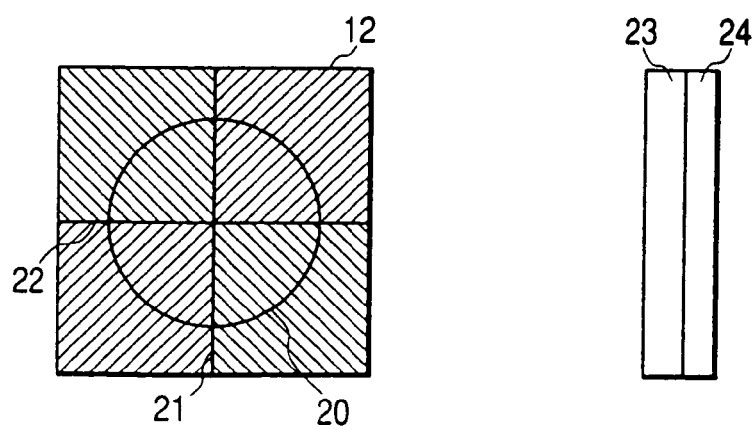
FIG. 2 is a diagram showing a beam splitting combined element.

FIG. 2 explains the grating plate 12. This grating plate is a combined element obtained by integrally laminating a polarizable grating 23 divided into four parts and a quarter wave plate 24 to each other. It is disposed so that the grating 23 faces the semiconductor laser chip side. The polarizable, quartered grating 23 is constituted by a birefringent optical crystal or liquid crystal plate, through which an incident light passes without refraction if it is an ordinary ray or which functions as a diffraction grating if the incident light is an extraordinary ray. When linearly polarized beams 6a and 6b emitted from the semiconductor lasers 4a and 4b are incident on the combined element 12 comprising the polarizable, quartered grating and the quarter wave plate, if they are incident as ordinary rays, pass through the polarizable grating portion and are then made into circularly polarized beams by the quarter wave plate in the combined element 12. The laser beams 6a and 6b after reflected by the optical disc are made into extraordinary rays by the quarter wave plate in the combined element and are then diffracted by the polarizable, quartered grating. The combined element 12 shown in FIG. 2 is divided into four regions by boundary lines 21 and 22. In the same figure, a circle 20 stands for the laser beam 6a or 6b, which is separated into four +1st order diffracted beams and four −1st order diffracted beams by the quartered grating. The beams thus separated reach the photodetector 7 or 8 on the semiconductor substrate 1 and are thereby subjected to photoelectric conversion into autofocus signal, tracking signal, and information signal. This point will be described below in detail.

Figures 3A, 3B:
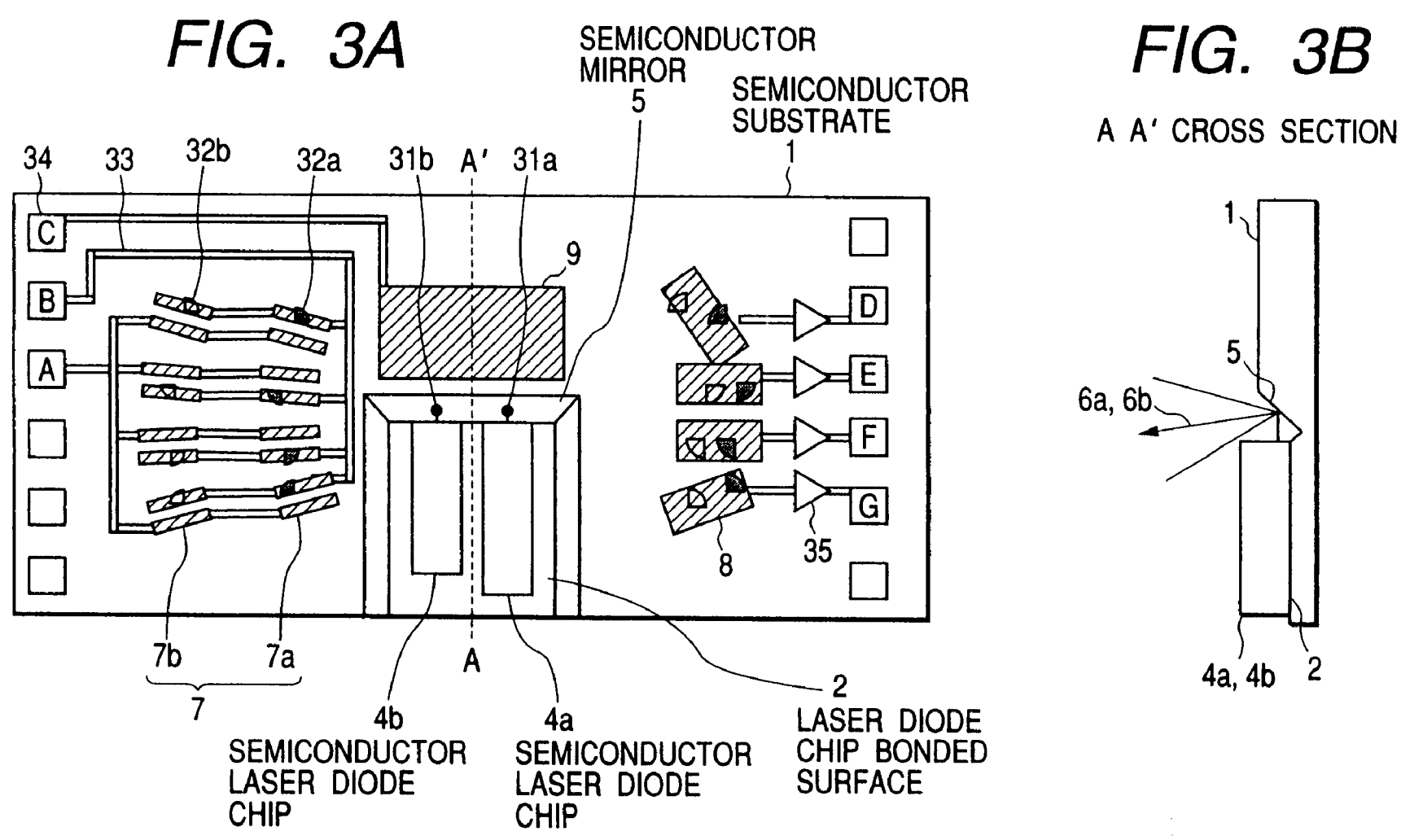

FIG. 3A shows a surface of the semiconductor substrate 1 as seen from the collimator lens 10 side. In the same figure, eight black-painted quarter circles indicated at 32a represent laser beams of wavelength λa separated by the grating 23, while eight quarter circles not painted out and indicated at 32b represent laser beams of wavelength λb separated by the grating. The photodetector 7, which is for obtaining an out-of-focus detection signal, comprises eight strip-like photodetector elements 7a for receiving the laser beams 32a of wavelength λa and eight strip-like photodetector elements 7b for receiving the laser beams 32b of wavelength λb. As an out-of-focus detecting method there is adopted a knife edge method (Foucault method), in which wiring is made using an electrically conductive thin film 33 such as aluminum film as shown in FIG. 3A, whereby differential signals are obtained from terminals A and B of wire bonding pads 34. The photodetectors 8 are four photodetectors used for obtaining a tracking error detection signal and an information reproduction signal. Output signals provided from the four photodetectors 8 pass through an amplifier 35 formed on the semiconductor substrate and are outputted from terminals D, E, F and G of pads 34. The photodetector 9 is for monitoring the quantities of light beams emitted from the semiconductor laser chips 4a and 4b. An output signal provided from the photodetector 9 is outputted from the terminal C of pad 34. Spots 31a and 31b represent reflected positions on a surface of the reflecting mirror 5 of the laser beams 6a and 6b emitted from the semiconductor chips 4a and 4b, respectively. For example, assuming that the grating pitches P of the four regions shown in FIG. 2 are equal to one another, that grating directions are +α, −α, +3α, and −3α degrees with respect to a vertical lien 21, and that a focal distance of the collimator lens is fc, the laser beams 32a of wavelength λa separated by the grating are focused on a circumference of radius Ra=fc*λ a/P centered at spot 31a and at positions spaced 2a degree from the center. Likewise, the laser beams 32b of wavelength λb separated by the grating are focused on a circumference of radius Rb=fc*λb/P centered at spot 31b and at positions spaced 2α degree from the center. If the spacing D between the light spots of the semiconductor laser chips 4a and 4b, which is the spacing between the spots 31a and 31b, is D☐fc*(λb−λa)/P, the focused positions of the laser beams of wavelength λa and the focused positions of the laser beams of wavelength λb can be made substantially coincident with each other. Consequently, as in this embodiment, the photodetectors and amplifier can be used in common to beams of different wavelengths, whereby not only the surface of the semiconductor substrate 1 can be saved but also the number of wire bonding pads and output lines can be decreased, with consequent reduction in size of a package which houses the semiconductor substrate therein.

FIG. 3B shows a sectional structure of the semiconductor substrate 1 at the position of dotted line A-A' in FIG. 3A. Preferably, the reflecting mirror 5 is formed at an angle of 45 degrees relative to a laser chip mounting surface 2. For example, the processing for forming a mirror surface on the silicon substrate is based on an anisotropic etching such that if the silicon (100) plane is etched using an aqueous solution of potassium oxide, there is formed a pyramid-shaped concave portion using the flat (111) plane as a slant surface because the etching speed of the (111) plane relative to the (100) plane is lower by approximately two digits. In this case, the angle of the (111) plane relative to the (100) plane is approximately 54.7°, so for forming a reflecting mirror of 45° it is necessary to use a silicon substrate with an off angle of about 9.7° in which a crystallographic axis is inclined relative to the surface. However, it is necessary that the off angle be determined taking also into account the adaptability of the semiconductor process for the formation of photodetectors and electronic circuits. The reflecting mirror 5 may be displaced from 45° or the direction of emission of the laser beam 6a or 6b may be displaced from the direction perpendicular to the semiconductor substrate 1.

Figure 4A:
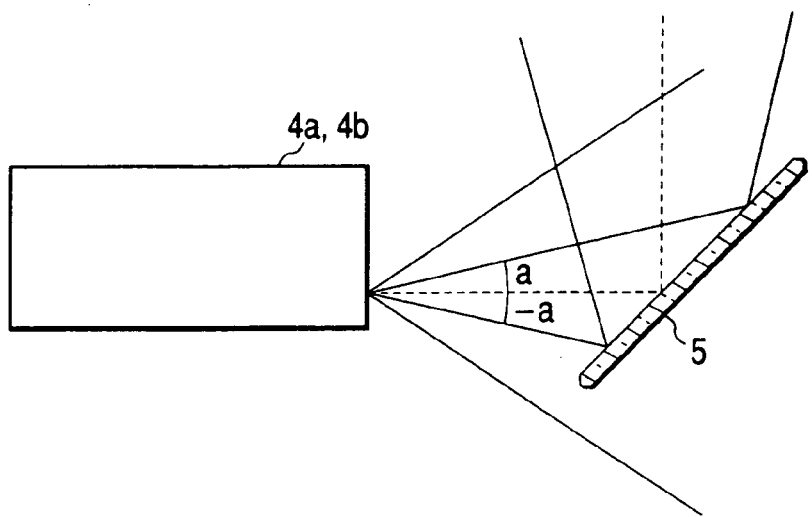
FIGS. 4A, 4B and 4C are diagrams for explaining the width of a mirror used in the embodiment.
Figure 4B:
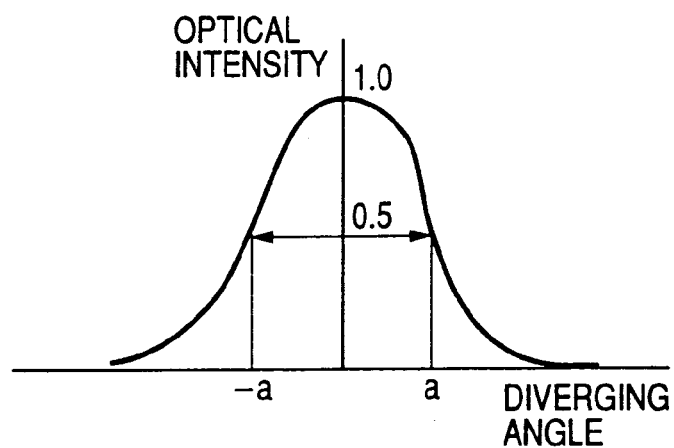
Figure 4C:
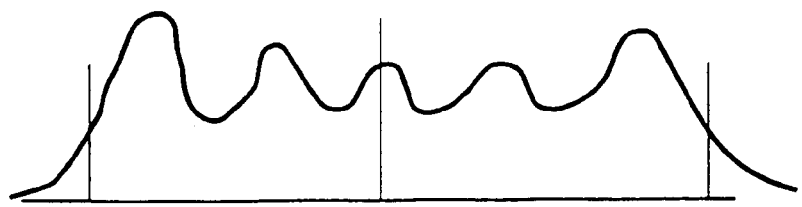

FIGS. 4A, 4B and 4C are diagrams explaining at what value the width of the reflecting mirror should be set. Generally, as shown in FIG. 4B, the beam emitted from a semiconductor laser spreads at a certain angle and the intensity distribution relative to the spread angle is approximated by Gaussian distribution. As in the configuration according to the invention shown in FIG. 4A, such a beam is partially reflected by the reflecting mirror 5 in the vicinity of the semiconductor laser 4a or 4b. If a portion of the beam is truncated, there occurs a so-called Fresnel diffraction phenomenon and the phase of wave surface is distorted, as shown in FIG. 4C. If such beams in a distorted state of the wave surface phase reach the objective lens 13, there occurs aberration in the spots 15 and 16 formed on the optical disc. If this point is considered geometrical-opticswise, such a phenomenon does not occur, but this phenomenon can be explained in terms of a wave-optic model. Since the amount of aberration generated depends on the truncation of beam, it is necessary that the width of the reflecting mirror be taken sufficiently large. In the present invention, the width of the reflecting mirror is set so that the full width at half maximum or more of the semiconductor laser intensity distribution is reflected, as shown in FIG. 4B.

Figure 5A:
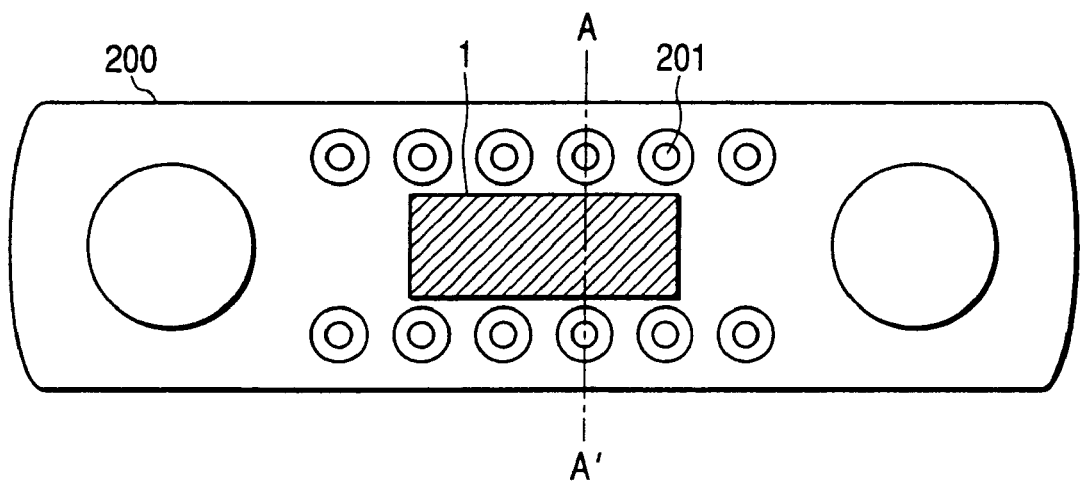
FIGS. 5A and 5B are diagrams showing a package form of the integrated light source.
Figure 5B:
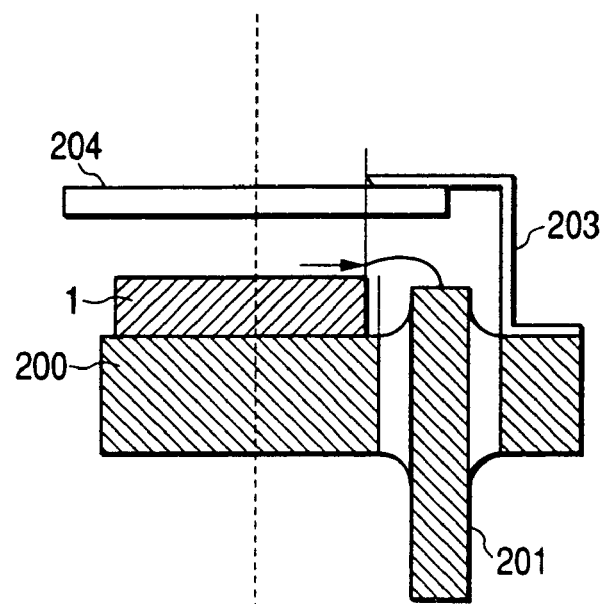

FIGS. 5A and 5B show a package for housing the semiconductor substrate 1 therein. The package comprises a package substrate 200 having conductor pins 201, and a silicon substrate 202. FIG. 5B is a sectional view taken on line A-A in FIG. 5A, in which there are used a cap 203 and a package sealing window 204 as components of the package. The window 204 of the package can also serve as the combined element 12 shown in FIG. 1.

Figure 6B:
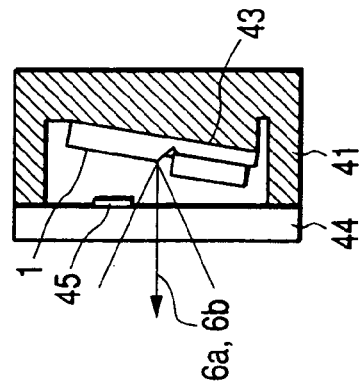
FIGS. 6A, 6B and 6C are diagrams showing the integrated light source mounted on a horizontal flat package.
Figure 6A:
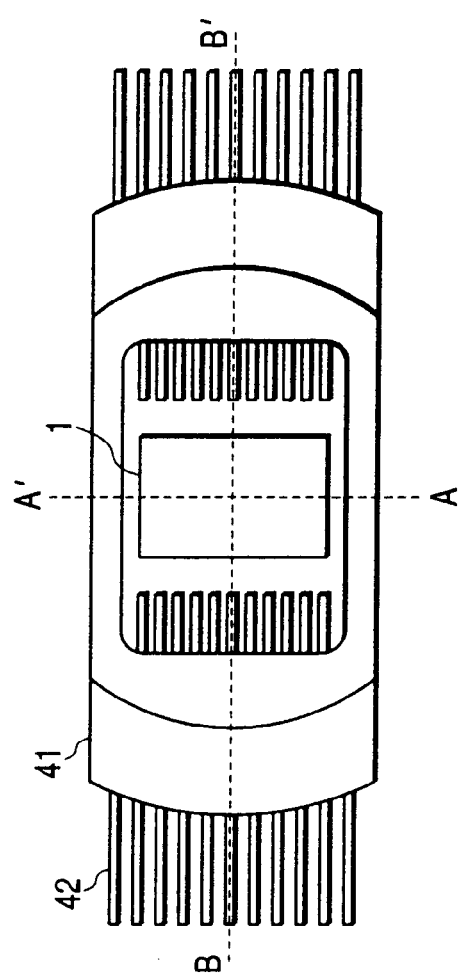
Figure 6C:
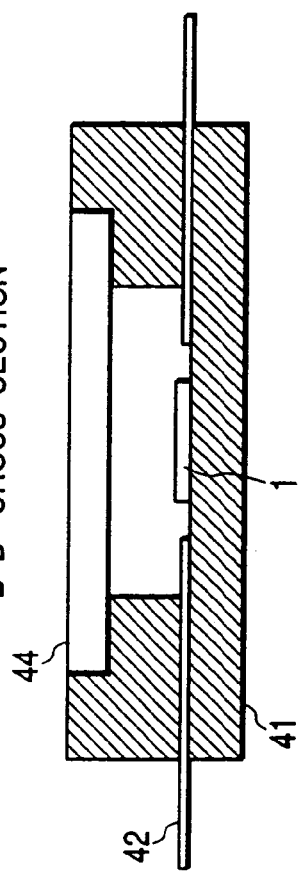

FIGS. 6A, 6B and 6C show another example of a package with the semiconductor substrate 1 housed therein, of which FIG. 6A shows the structure of the package, FIG. 6B is a sectional view taken on broken line A-A', and FIG. 6C is a sectional view taken on broken line B-B'. Numeral 42 denotes a lead wire, which is connected to the semiconductor substrate 1 through bonding wires of pads 34. A surface of a pedestal 43 for mounting the semiconductor substrate 1 thereon is inclined so that the laser beams 6a and 6b are emitted in a direction perpendicular to the package. Numeral 44 denotes a glass cover for sealing the semiconductor substrate 1. On an inner side of the glass cover 44 is provided a reflecting surface 45 for reflecting outer peripheral portions of the laser beams 6a and 6b. Beams reflected by the reflecting surface 45 are received by the photodetector 9 on the semiconductor substrate 1, which in turn afford signals for monitoring the quantity of light emitted from each of the semiconductor laser chips 4a and 4b.

Figure 7:
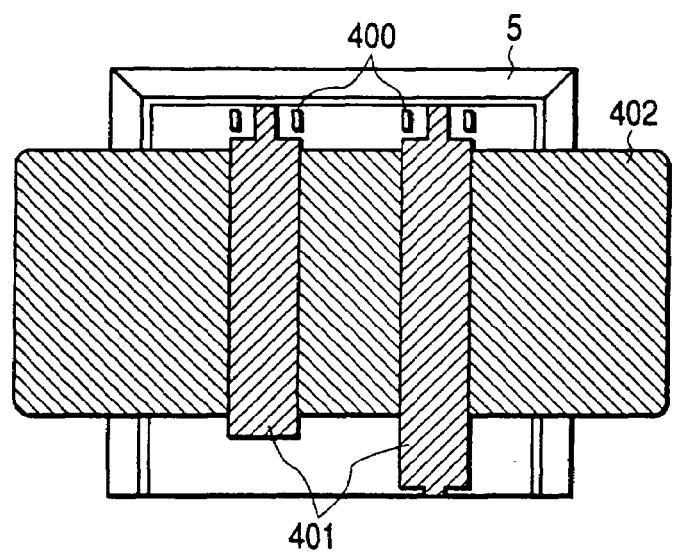
FIG. 7 is a diagram showing an integrating substrate for the integrated light source, as well as alignment index, solder and electrode patterns.
Figure 8:
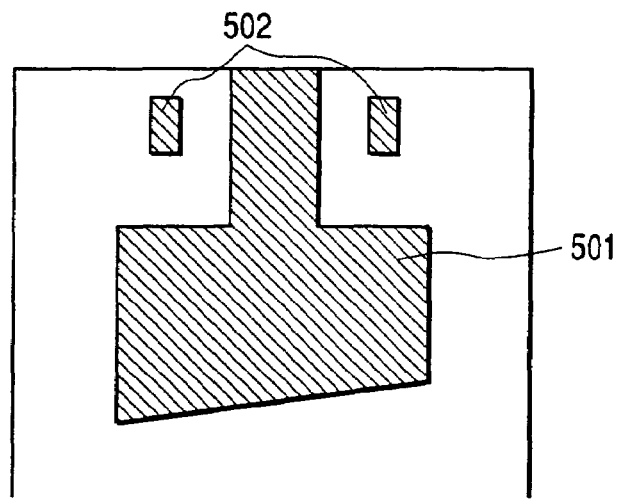
FIG. 8 is a diagram showing alignment index patterns affixed to semiconductor lasers in the embodiment.
Figure 9:
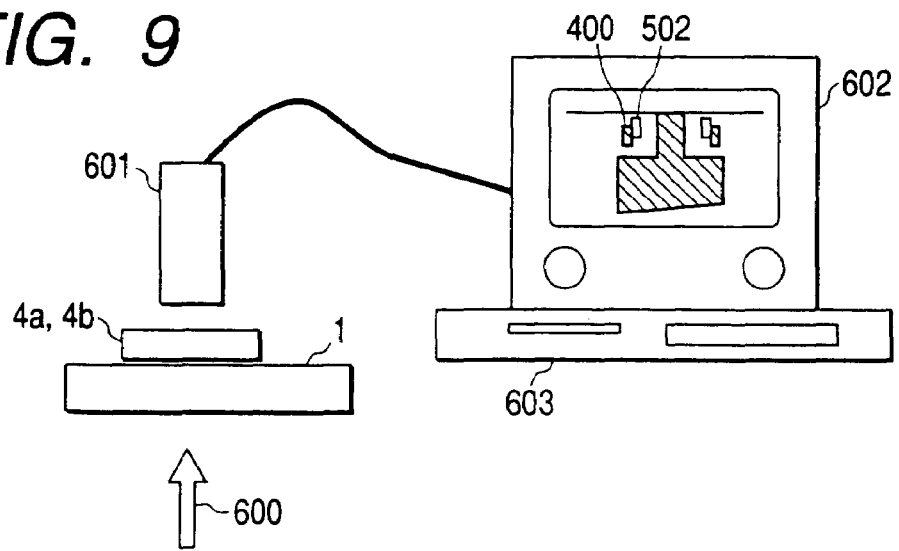
FIG. 9 is a diagram showing a method for alignment between indexed semiconductor laser light sources and an integrating substrate with corresponding index patterns affixed thereto.

Now, with reference to FIGS. 7, 8, 9, and 10, the following description is provided about a method for mounting a plurality of semiconductor lasers onto a silicon semiconductor substrate. In FIG. 7, index patterns 400 are affixed to the silicon substrate 1 according to the present invention. Numeral 401 denotes a solder pattern, onto which a semiconductor laser is soldered. An electrode pattern 402 is formed and connected to the solder pattern 401. On the other hand, FIG. 8 shows a solder pattern 501 formed on rear sides of the corresponding semiconductor lasers 4a and 4b and index patterns 502 for alignment. FIG. 9 explains a method for alignment between the index patterns 400 formed on the substrate 1 and the index patterns 502 formed on the rear sides of the semiconductor lasers 4a and 4b. In the same figure, the substrate 1 and the semiconductor lasers 4a, 4b are irradiated with an infrared light 600 from the surface side or the back side, then reflected or transmitted beam is received by a microscope 601, and index patterns are enlarged and projected on a video monitor 602. Further, center positions of the index patterns 400 and 502 are calculated by means of a computer 603 and the substrate 1 or the semiconductor lasers are inched until a positional deviation between two centers becomes zero. Completion of the alignment is followed by tact bonding and subsequent soldering in a solder reflow oven.

Figure 10:
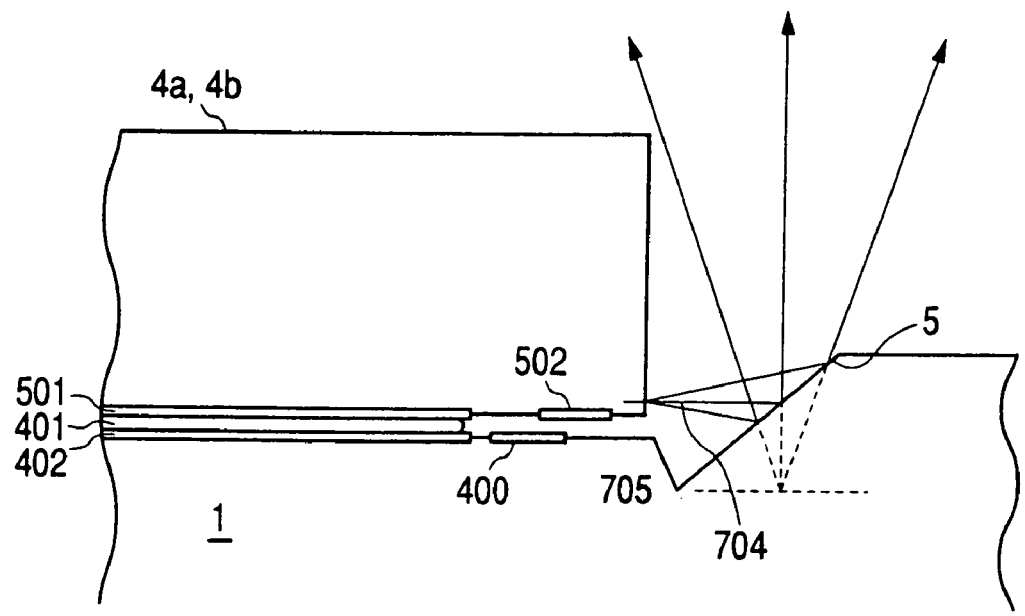
FIG. 10 is a sectional view taken on line A-A' in FIG. 3A.

FIG. 10 is a sectional view showing a state in which the semiconductor lasers 4a and 4b have been soldered onto the substrate 1 with mirror, which corresponds to a section taken along line A-A' in FIG. 3A. On the rear sides of the semiconductor lasers are formed electrodes 701 and index patterns 502 for alignment, and the semiconductor lasers are soldered onto the substrate 1 with electrode 701 and solder 702 formed thereon. Alignment of the semiconductor lasers and the substrate is performed between index patterns 502 and 400. The beam from the semiconductor laser 4a or 4b forms a light spot 704 and is reflected by the mirror 5, then passes the beam splitter and objective lens and reaches the optical disc. In order that the beam from the light spot 704 should not be truncated by the bottom of the substrate, a pedestal 705 is formed on the substrate.

Figure 11:
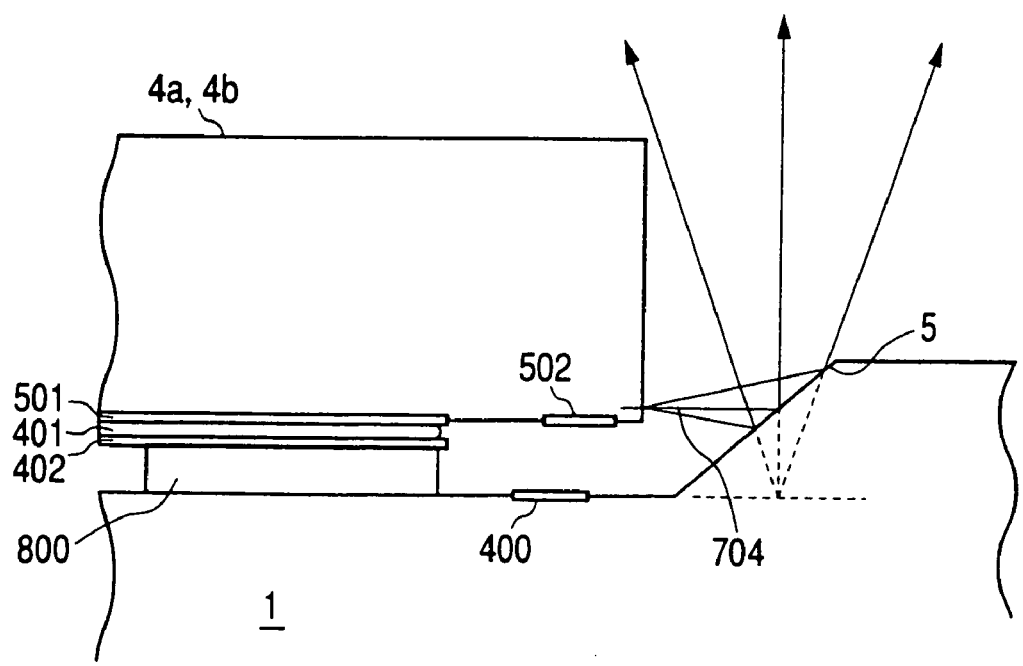
FIG. 11 is a sectional view of an integrating substrate having a layer for promoting the radiation of heat from semiconductor laser light sources.
Figure 12:
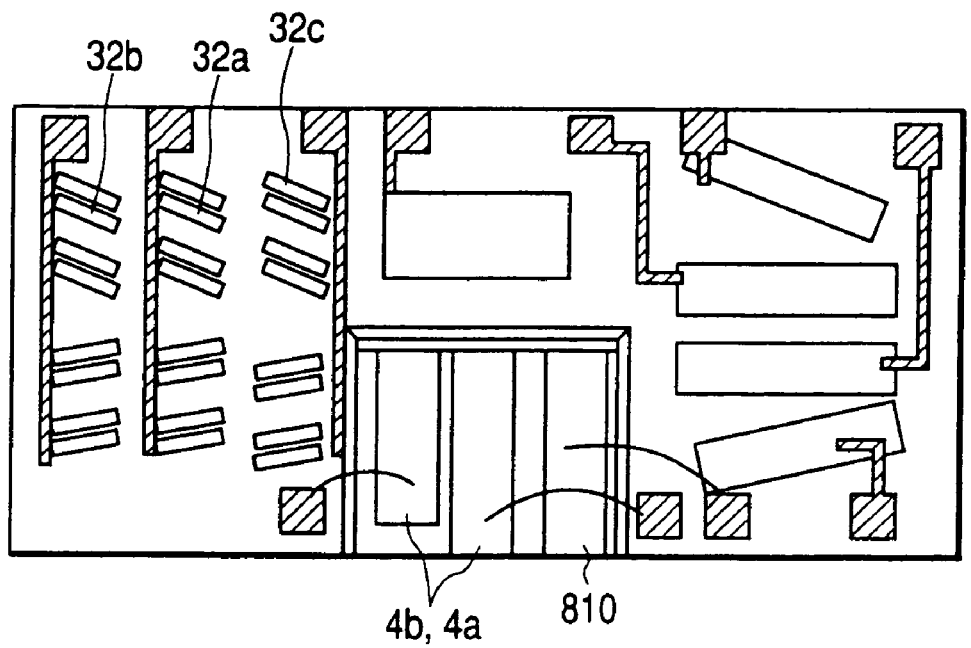
FIG. 12 is a diagram showing three types of semiconductor laser light sources mounted on an integrating substrate used in the embodiment.

FIG. 11 shows an example in which, for improving the radiation of heat, a layer of a material 800 having a high thermal conductivity is disposed just under the semiconductor lasers. The heat generated in an active layer of each semiconductor laser is diffused just thereunder, allowing heat conduction to take place over a wider area to decrease the thermal resistance up to a heat sink. The material layer 800 can be endowed with a function of relaxing a stress induced by a difference in thermal expansion coefficient between the semiconductor lasers and the substrate.

Figure 13:
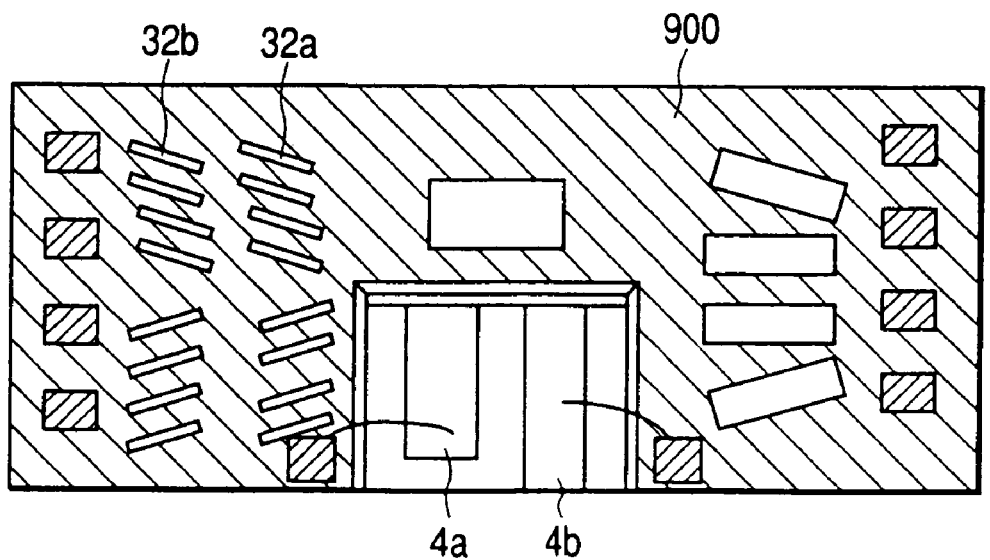
FIG. 13 is a diagram showing an OEIC (Optoelectric Integrated Circuit) including an amplifier and photodetectors is integrated monolithically on the integrating substrate.

FIG. 13 shows an example in which three semiconductor lasers are arranged in a multi-wavelength module according to the present invention, which lasers are, successively from the right-hand side, a bluish purple color semiconductor laser 810 having a wavelength of approximately 410 nm, a red color laser 306 having a wavelength of approximately 660 nm, and an infrared laser 307 having a wavelength of approximately 780 nm. Three sets of corresponding photodetectors 304, 303 and 811 are formed for tracking, showing an example in which one set of a photodetector serves for both tracking and reproduction signal. These three kinds of wavelengths are associated with recording/reproducing optical discs, including super DVD, DVD, and CD, which are being standardized.

FIG. 13 illustrates an integration module further embodying the present invention. An amplifier 900 for amplifying light currents provided from photodetectors 303, 304 and 302 is formed monolithically on a silicon or GaN substrate 102, whereby the number of components used is reduced and it is thereby possible to improve the degree of integration.

According to the present invention, as set forth above, it is possible to effect the reduction in size and integration of an optical head which carries a plurality of semiconductor lasers and hence possible to attain the reduction in size and thickness of the whole of an optical disc apparatus for both recording and reproduction such as CD, DVD, and an optical disc capable of carrying bluish purple color lasers.

What is claimed is:

1. A method for fabricating an optical head comprising the steps of:

aligning a semiconductor substrate and a plurality of semiconductor lasers, by using infrared light, first alignment marks affixed to a surface of said semiconductor substrate on which photodetectors for automatic focus detection and tracking detection are formed monolithically, each of said photodetectors having sensitivity at corresponding wavelengths of said plurality of semiconductor lasers which have different respective wavelengths, and second alignment marks affixed to rear surfaces of a plurality of said semiconductor lasers which have different respective wavelengths, and bonding said semiconductor substrate and said semiconductor lasers so that said surface of said semiconductor substrate and said rear surfaces of said semiconductor lasers are opposite each other.

2. A method for fabricating an optical head according to claim 1, further comprising the step of forming a tilted mirror in said semiconductor substrate.

* * * * *